United States Patent
Chang et al.

(10) Patent No.: US 11,127,592 B2
(45) Date of Patent: Sep. 21, 2021

(54) PHOTOSENSITIVE GROUPS IN RESIST LAYER

(71) Applicant: Taiwan Semiconductor Manufacturing Co., Ltd., Hsin-Chu (TW)

(72) Inventors: Ya-Ching Chang, Hsinchu (TW); Ching-Yu Chang, Yilang County (TW); Chin-Hsiang Lin, Hsin-Chu (TW); Yen-Hao Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 235 days.

(21) Appl. No.: 15/994,091

(22) Filed: May 31, 2018

(65) Prior Publication Data
US 2019/0371600 A1    Dec. 5, 2019

(51) Int. Cl.
| | | |
|---|---|---|
| *G03F 7/004* | (2006.01) | |
| *H01L 21/027* | (2006.01) | |
| *H01L 21/02* | (2006.01) | |
| *G03F 7/00* | (2006.01) | |
| *G03F 7/095* | (2006.01) | |
| *G03F 7/16* | (2006.01) | |
| *B05D 1/00* | (2006.01) | |

(52) U.S. Cl.
CPC ........ *H01L 21/0274* (2013.01); *G03F 7/0035* (2013.01); *G03F 7/0045* (2013.01); *G03F 7/095* (2013.01); *G03F 7/16* (2013.01); *H01L 21/02282* (2013.01); *B05D 1/005* (2013.01)

(58) Field of Classification Search
CPC ...... G03F 7/038; G03F 67/0382; G03F 7/039; G03F 7/0392; G03F 7/2004; G03F 7/0045
USPC ..................... 430/270.1, 325, 326
See application file for complete search history.

(56) References Cited

U.S. PATENT DOCUMENTS

| | | | |
|---|---|---|---|
| 6,342,334 B1 * | 1/2002 | Yamana | G03F 7/0045 430/270.1 |
| 8,796,666 B1 | 8/2014 | Huang et al. | |
| 9,093,530 B2 | 7/2015 | Huang et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 2003/0044717 A1 * | 3/2003 | Kodama | G03F 7/0045 430/270.1 |
| 2012/0077131 A1 * | 3/2012 | Enomoto | G03F 7/0397 430/325 |
| 2014/0127626 A1 * | 5/2014 | Senzaki | G03F 7/165 430/281.1 |
| 2016/0342087 A1 | 11/2016 | Cheng et al. | |
| 2017/0059989 A1 * | 3/2017 | Kudo | G03F 7/322 |
| 2019/0219922 A1 * | 7/2019 | Kaneko | C08F 212/20 |
| 2019/0243244 A1 * | 8/2019 | Kaneko | C08F 2/48 |

FOREIGN PATENT DOCUMENTS

| | | |
|---|---|---|
| TW | I225186 B | 12/2004 |
| WO | WO 2018/056369 A1 * | 3/2018 |
| WO | WO 2018/070327 A1 * | 4/2018 |

* cited by examiner

*Primary Examiner* — John A McPherson
(74) *Attorney, Agent, or Firm* — Haynes and Boone, LLP

(57) ABSTRACT

A method includes forming a photoresist layer over a substrate, where the photoresist layer includes a polymer blended with a photo-acid generator (PAG), exposing the photoresist layer to a radiation source, and developing the photoresist layer, resulting in a patterned photoresist layer. The PAG is bonded to one or more polarity-enhancing group (PEG), which is configured to increase a dipole moment of the PAG. The exposing may separate the PAG into a cation and an anion, such that a PEG bonded to the cation and a PEG bonded to the anion each increases a polarity of the cation and the anion, respectively.

20 Claims, 5 Drawing Sheets

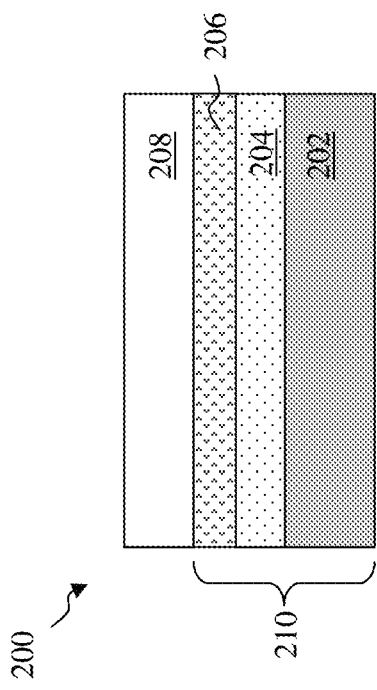
FIG. 2
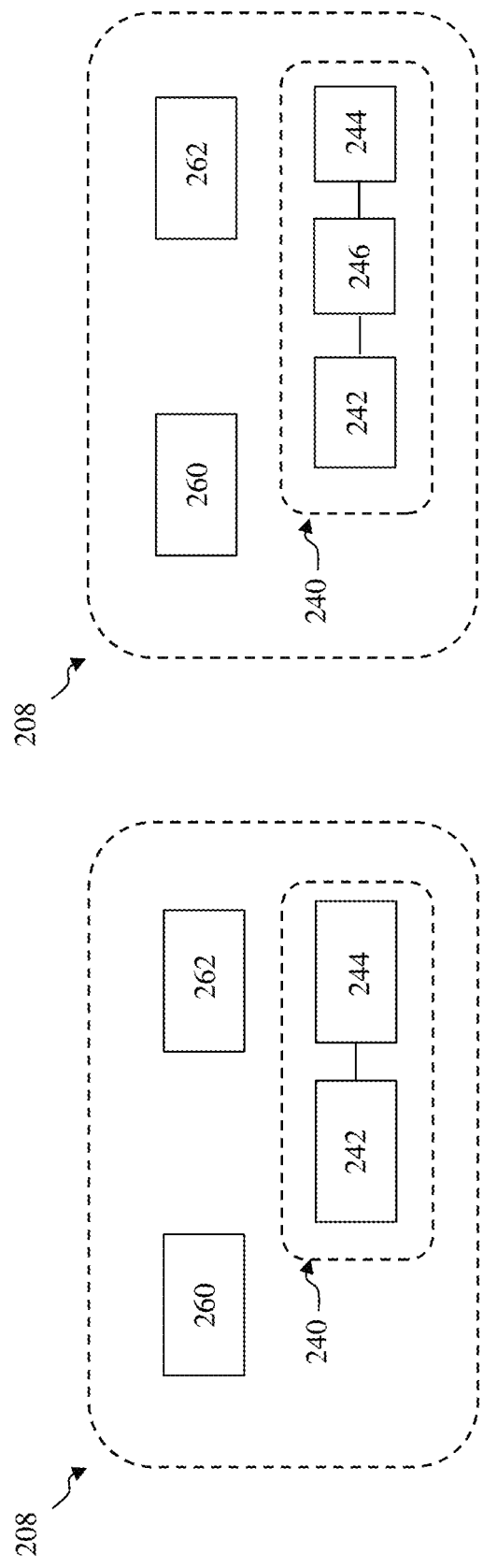
FIG. 3A
FIG. 3B

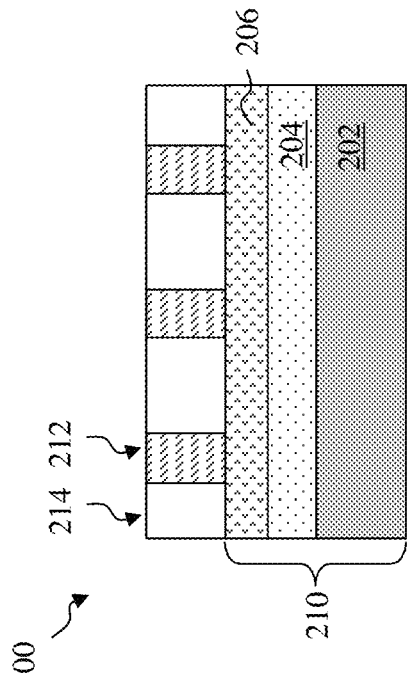
FIG. 5
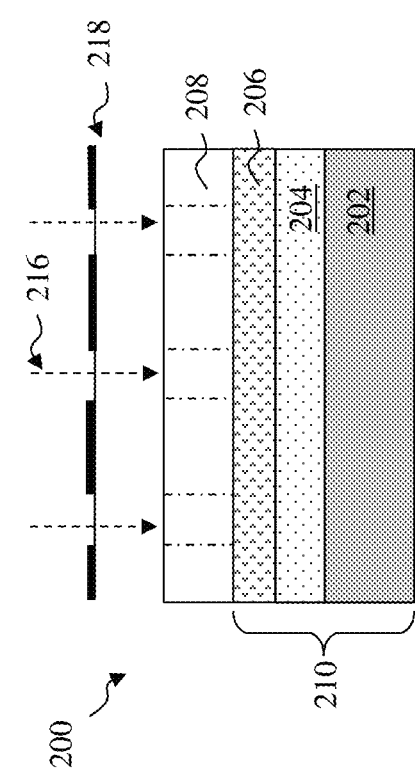
FIG. 6
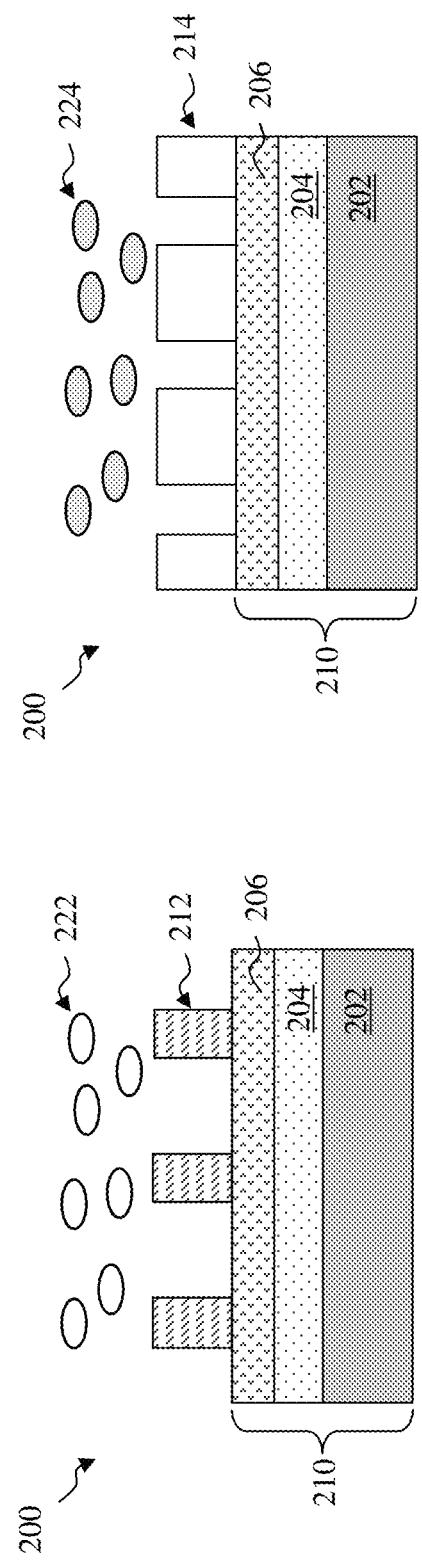
FIG. 7A
FIG. 7B

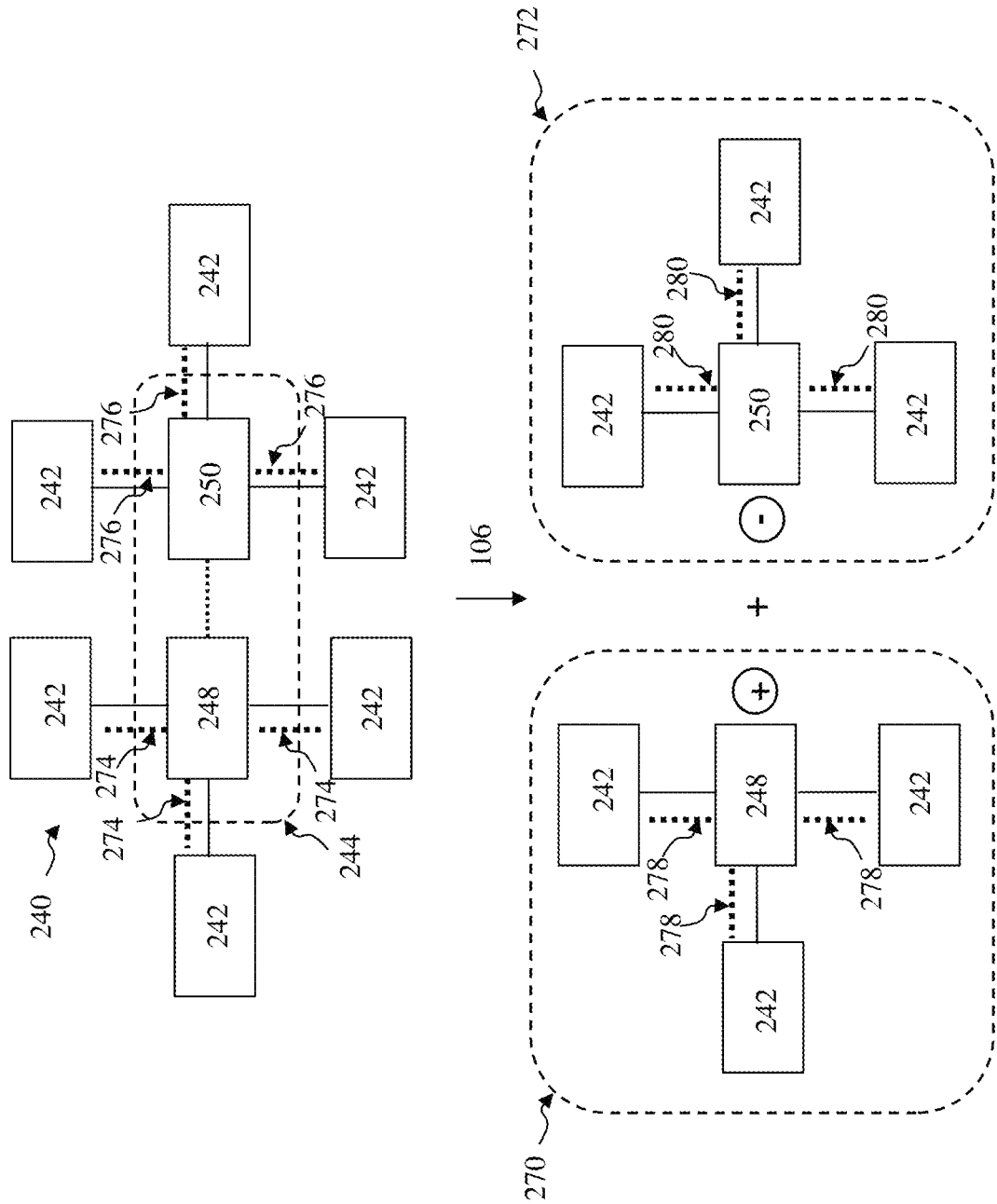

PHOTOSENSITIVE GROUPS IN RESIST LAYER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

Lithography processes, for example, are extensively utilized in integrated circuit (IC) manufacturing, where various resist patterns are transferred to a workpiece to form an IC device. In many instances, quality of a resist pattern directly impacts quality of the resulting IC device. As IC technologies continually progress towards smaller technology nodes (for example, down to 14 nanometers, 10 nanometers, and below), resolution, roughness (for example, line edge roughness (LER) and/or line width roughness (LWR)), and/or contrast of the resist pattern are factors critical to the quality of resist patterns. Although existing lithography techniques for optimizing such parameters have been generally adequate, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 2, 5, 6, 7A, and 7B are fragmentary cross-sectional side views of an exemplary semiconductor device at intermediate steps of the method of FIG. 1 according to various aspects of the present disclosure.

FIGS. 3A and 3B illustrate embodiments of compositions of a material layer according to various aspects of the present disclosure.

FIGS. 4 and 8 illustrate embodiments of chemical structures according to various aspects of the present disclosure.

DETAILED DESCRIPTION

Figure 1:
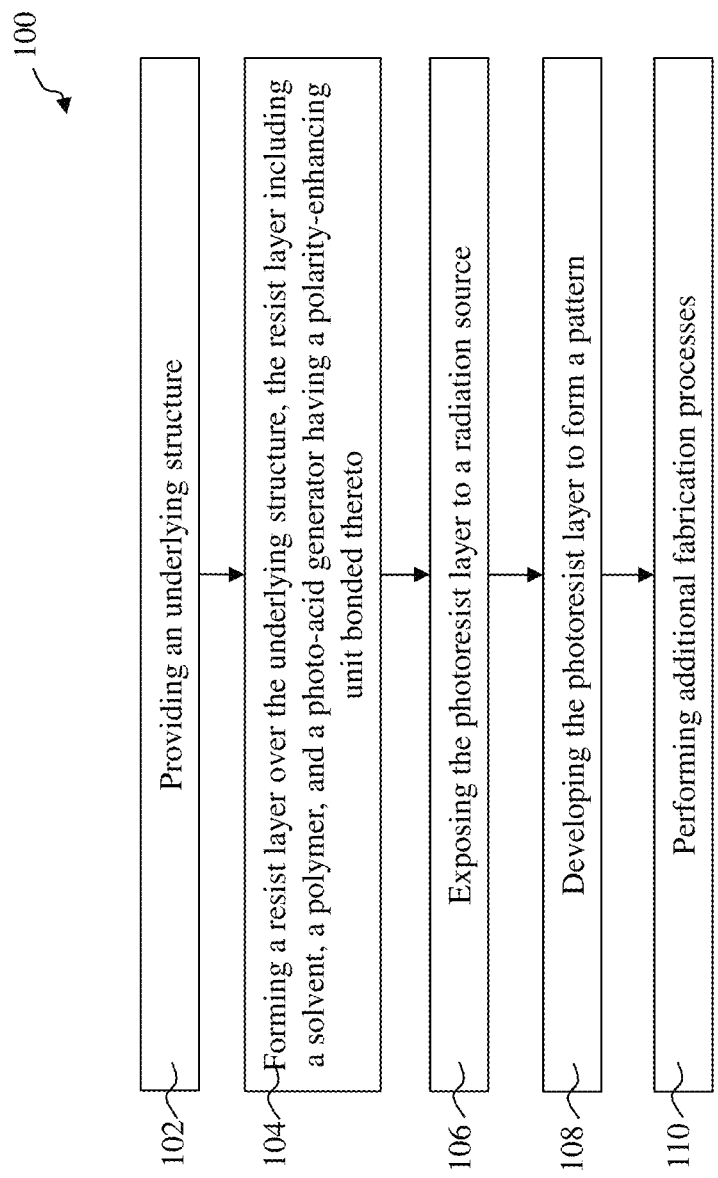
FIG. 1 is a flowchart of a method for fabricating an exemplary semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

A lithography process involves forming a resist layer over a workpiece and exposing the resist layer to patterned radiation. After being exposed to the patterned radiation, the resist layer is developed in a developer (in other words, a chemical solution). The developer removes portions of the resist layer (for example, exposed portions of positive tone resist layers or unexposed portions of negative tone resist layers), thereby forming a patterned resist layer. The patterned resist layer is then often used as a masking element during a subsequent process, such as an etching process or an implantation process, to transfer a pattern in the patterned resist layer to the workpiece. Advanced lithography materials, such as chemically amplified resist (CAR) materials, have been introduced to improve sensitivity of the resist layer to the radiation, thereby maximizing utilization of the radiation. Sensitivity (S) generally corresponds with an amount of incident radiation (amount of energy per unit area) required to produce sufficient chemical reactions to define a pattern in a resist layer. For example, CAR materials can generate multiple chemical reactions upon exposure to radiation, thereby chemically amplifying a response to the radiation, which lowers exposure doses required for defining the pattern in the resist layer. CAR materials typically include a polymer that is resistant to an IC process (such as an etching process), an acid generating component (such as a photoacid generator (PAG)), and a solvent component. The PAG generates acid upon exposure to radiation, which functions as a catalyst for causing chemical reactions that alters solubility of exposed portions of a resist layer in a given developer.

While CAR materials are configured to minimize sensitivity, CAR materials must also satisfy other resist performance characteristics, such as resolution, roughness, and contrast. Resolution generally describes an ability of a resist material to print (image) a minimum feature size with acceptable quality and/or control, where resist contrast, resist thickness loss, proximity effects, swelling and/or contraction of the resist material (typically caused by development), and/or other resist characteristics and/or lithography characteristics contribute to the resolution. Resist contrast generally refers to an ability of a resist material to distinguish between light (exposed) regions and dark (unexposed) regions, where resist materials with higher contrasts provide better resolution, resist profiles, and/or LER. Roughness, such as LER and/or line width roughness (LWR), generally describes whether a pattern in a resist layer includes edge variations, width variations, critical dimension variations, and/or other variations. LER generally describes deviations in edges of a line, whereas LWR generally describes deviations of width of a line (for example, from critical dimension (CD) width).

Extreme ultraviolet (EUV) lithography, which utilizes radiation having wavelengths in the EUV range, provides promise for meeting finer lithography resolution limits, particularly for sub-10 nm IC manufacturing. However, higher sensitivity CAR materials are often required at EUV wavelengths because exposure doses required for meeting resolution, contrast, and/or roughness requirements, along with throughput requirements (such as wafers per hour (WPH)), are limited by conventional EUV sources. For example, since a number of photons absorbed by a volume of a resist material is proportional to wavelength and an amount of absorbed energy is proportional to exposure dose, total absorbed energy is discretized into fewer photons as wavelength decreases. It has thus been observed that a volume of resist material absorbs fewer EUV photons than DUV photons (such as ArF photons) when exposed to the same exposure dose (for example, about 10 mJ/cm$^2$), which often means that less acid will be generated by CAR materials for catalyzing reactions. To overcome this phenomenon, which is generally referred to as shot noise, one method is to increase amount of PAGs included in the resist material, thereby increasing the extent and efficiency of acid generation initiated by the exposure process. However, an increased amount of PAG could lead to excessive dissolution of an exposed region of the resist pattern in a negative-tone development (NTD) process, or conversely, to incomplete dissolution of the exposed region in a positive-tone development (PTD) process. For example, excessive dissolution may lead to rounding or collapsing of the resist pattern, while incomplete dissolution may lead to scum and/or footing at bottom of features in the resist pattern. Furthermore, in the case of the NTD process, excessive dissolution of the exposed region due to the higher amount of PAG may require a greater radiation dosage during the exposure process, thus raising the energy cost associated with the patterning process.

Accordingly, for these and other reasons, improvements are desired with respect to controlling the extent of dissolution in the resist pattern during the resist development process. As demonstrated by embodiments below, controlling the extent of dissolution may be achieved by incorporating polarity-enhancing groups in the resist material to tune a solubility of the resist material in the developer following the exposure process.

Figure 4:
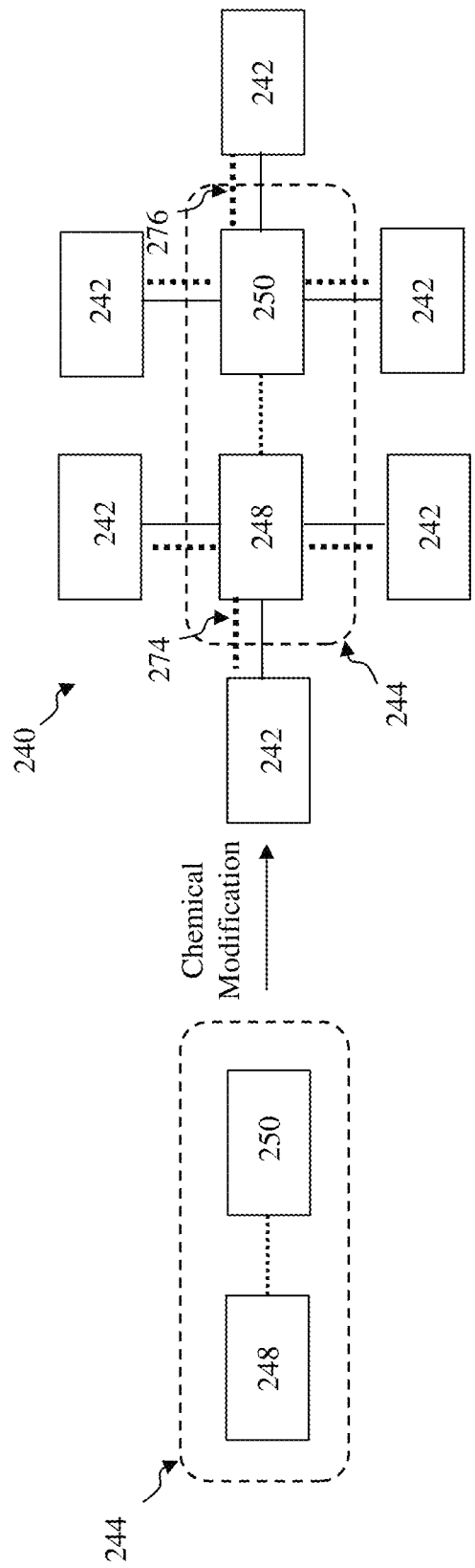

FIG. 1 illustrates a flowchart of a method 100 for processing a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the process. Intermediate steps of the method 100 are described with reference to fragmentary cross-sectional side views of the workpiece 200 as shown in FIGS. 2, 5, 6, 7A, and 7B, while schematic representations of exemplary compositions and chemical structures are shown in FIGS. 3A, 3B, and 4. For clarity and ease of explanation, some elements of the figures have been simplified.

Referring to FIGS. 1 and 2, the method 100 provides (or is provided with) an underlying structure 210 at operation 102. The underlying structure 210 may be a single-layer material having a uniform composition or a multi-layer structure having similar or different compositions suitable for IC device manufacturing. In the depicted embodiment, the underlying structure 210 includes multiple material layers, each of which will be discussed in detail below.

The underlying structure 210 may include a substrate 202. The substrate 202 may comprise an elementary (single element) semiconductor, such as silicon and/or germanium; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or other suitable materials. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, or combinations thereof.

The substrate 202 may include various circuit features formed thereon or therein including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof. In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron or $BF_2$, depending on design requirements. The doped regions may be planar or non-planar (e.g., in a fin-like FET device) and may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIG. 2, the underlying structure 210 may include a bottom layer 204 (or a first layer) formed over the substrate 202. In many embodiments, the bottom layer 204 is an anti-reflective coating (ARC) whose composition is chosen in order to minimize reflectivity of radiation implemented during exposure of a subsequently-formed resist layer (e.g., resist layer 208). The bottom layer 204 may be formed by spin-coating an ARC material (e.g., an amorphous carbon material) onto a top surface of the substrate 202 (or a top surface of the topmost material layer of a multi-layered substrate 202) and optionally baked for curing.

The underlying structure 210 may additionally include a middle layer 206 (or a second layer) formed over the bottom layer 204. The middle layer 206 may be a single-layer structure or may include multiple layers each having a different composition. In many embodiments, the middle layer 206 has a composition that provides anti-reflective properties, hard mask properties, and/or barrier properties for a subsequently implemented lithography process. The middle layer 206 may include a silicon-rich polymer and/or other suitable materials. Alternatively or additionally, the middle layer 206 may include a dielectric material, such as silicon oxide, silicon nitride, silicon carbide, silicon oxynitride, and/or other suitable materials. The middle layer 206 may be formed by a spin-coating process similar to that described with respect to the bottom layer 204 and/or a deposition process, such as chemical vapor deposition (CVD), atomic layer deposition (ALD), physical vapor deposition (PVD), spin-coating, other suitable processes, or combinations thereof. In some embodiments, the bottom layer 204 and/or the middle layer 206 are omitted from the underlying structure 210. In some embodiments, the underlying structure 210 includes additional material layers formed over the middle layer 206.

Referring to FIGS. 1 and 2, the method at operation 104 forms a resist (e.g., photoresist) layer 208 over the underlying structure 210. In the depicted embodiment, the resist layer 208 is a photosensitive layer operable to be patterned by an exposure process, which initiates a series of photochemical reactions in the resist layer 208. The resist layer 208 may include any suitable photosensitive resist material, and in many embodiments, the resist layer 208 includes a resist material sensitive to radiation (e.g., UV light, deep ultraviolet (DUV) radiation, and/or EUV radiation). However, the principles of the present disclosure apply equally to e-beam resists and other direct-write resist materials. In the depicted embodiment, the resist layer 208 includes an EUV-sensitive resist material. The resist layer 208 may include a single-layer material or multiple material layers.

Referring to FIGS. 3A and 3B, the resist layer 208 may include a polymer 260, a photosensitive unit 240, and a solvent 262. In the depicted embodiment, the photosensitive unit 240 is blended with the polymer 260, which are together dissolved in the solvent 262. In many embodiments, a plurality of photosensitive unit 240 is included in the resist layer 208 and distributed throughout the resist layer 208. In many embodiments, the polymer 260 includes an acrylate-based polymer, a poly(norbornene)-co-maleic anhydride (COMA) polymer, a poly(hydroxystyrene)-based polymer, other suitable polymers, or combinations thereof, and may include any number of functional groups configured to assist one or more subsequent processes. In some examples, the functional groups may include photosensitive groups (e.g., sensitizers) such as phenol, styrene, fluoride, other suitable groups, or combinations thereof. In some example, the functional groups may include acid-labile groups (ALGs) configured to be cleavable by an acidic moiety (e.g., acid generated by a photoacid generator).

In some embodiments, referring to FIG. 3A, the photosensitive unit 240 includes a polarity-enhancing group (PEG) 242 bonded to a photoacid generator (PAG) 244. In the depicted embodiment, the resist layer 208 includes at least 15% (by weight) of the PAG 244. In many embodiments, if the amount of PAG 244 is less than about 15%, the resist layer 208 may not be chemically sensitive enough to effect a desired amount of change to the polymer 260 upon exposure. As will be discussed below, multiple PAGs may be included in each photosensitive unit 240 and each PAG 244 may be bonded to multiple PEGs 242. In some embodiments, referring to FIG. 3B, the photosensitive unit 240 includes a PAG 244 bonded to a PEG 242 via a linking group 246. The linking group 246 is configured to control a separation distance between the PAG 244 and the PEG 242 and may include any suitable structure, such as an alkyl group having 1 to 5 carbon atoms. The linking group 246 may be further configured to increase hydrophobicity of the PAG 244 (i.e., to decrease affinity of the PAG 244 to water or a water-based solution). In some embodiments, the linking group 246 is non-polar and does not have a net dipole moment (i.e., a net dipole moment of zero). In embodiments in which multiple PEGs 242 are bonded to the PAG 244, one or more linking group 246 may be disposed between each PEG 242 and the PAG 244 (FIGS. 3B and 4); alternatively, the linking group 246 may be omitted, such as that illustrated in FIG. 3A.

Referring to FIG. 4, the PAG 244 may be an ionic compound that includes a positively charged portion 248 (hereafter referred to as cation 248) and a negative charged portion 250 (hereafter referred to as anion 250) held together by an ionic bond indicated by a dotted line. In the depicted embodiment, the PAG 244 has a net charge of zero when the cation 248 and the anion 250 are bonded together by the ionic bond. In many embodiments, the PAG 244 includes cations such as sulfoniums, iodoniums, sulfonyl imides, derivatives thereof, and/or other suitable cations, anions such as triflates, nonaflate, sulfonates, derivatives thereof, and/or other suitable anions. Non-limiting examples of the PAG 244 include N-sulfonyloxyimide, benzoinsulfonate, pyrogallol trisulfonate, nitrobenzyl sulfonate, triphenylsulfonium nonaflate, sulfonyldiazomethane-based compounds, sulfone-based compounds, glyoxime-based compounds, derivatives thereof, other compounds, or combination thereof.

Notably, still referring to FIG. 4, the PAG 244 may undergo a chemical modification process such that multiple PEGs 242 may be covalently attached to the PAG 244. Although in the depicted embodiment three PEGs 242 are bonded to each of the cation 248 and the anion 250, embodiments of the present disclosure are not limited to this configuration and may include any number of PEGs 242 bonded to the cation 248 and/or the anion 250. For embodiments (not shown) in which the linking group 246 is bonded to the PAG 244 and the PEG 242, additional chemical modification process(es) may be implemented to the PAG 244 and the PEGs 242, such that they may each be configured to bond with the linking group 246.

In many embodiments, still referring to FIG. 4, the PEG 242 is configured to increase magnitude of a dipole moment 274 or dipole moment 276 of a bond formed between the PEG 242 and the PAG 244 (i.e., the cation 248 and the anion 250, respectively). In the present disclosure, a "dipole moment" measures the tendency for electron density to shift (or be shifted) within a chemical bond between two atoms. In many instances, one of the two atoms may influence the dipole moment of the bond if it exhibits a greater attraction of electrons than the other atom. This is evident in atoms having a relatively higher electronegativity, which describes the tendency of an atom to attract electrons or shift electron density towards itself. When the dipole moment is greater than zero, or when the attraction of electrons is disproportionate between the two atoms bonded together, such a bond is considered a "polar bond," and the bond is said to exhibit polarity. Accordingly, polarity of a polar bond is determined by the interaction between the two atoms (or between functional groups to which the atoms respectively belong), rather than chemical properties of either one of the atoms alone, and a greater magnitude of dipole moment in the bond indicates a greater polarity between the two atoms. In the depicted embodiment, the PEG 242 is configured to induce or increase magnitude of the dipole moment 274 and/or the dipole moment 276 of the bonds formed between the PEG 242 and the PAG 244.

However, in the depicted embodiment, the PEG 242 is not required to exhibit a net dipole moment (i.e., polar) itself. A molecular structure (e.g., the PEG 242), polar or otherwise, may establish a polar bond with another molecular structure and thus induce or increase a net dipole moment therein if the atoms participating in the bond exhibit a dipole moment whose magnitude is greater than zero (i.e., forming a polar bond between the two molecular structures). In instances where a molecular structure is ionic and subsequently separates into a cation (loss of at least one electron; e.g., the cation 248) and an anion (gain of at least one electron; e.g., the anion 250), each of the cation and the anion experiences to a greater extent the influence of a polar bond it forms with another molecular structure. In other words, magnitude of the dipole moment in a bond formed between a charged particle (a cation or an anion) and a molecular structure configured to form a polar bond therewith is greater than that between a neutral particle and the same molecular structure.

In many embodiments, the PEG 242 is polar (i.e., having a net dipole moment) and is configured to form a polar bond with the PAG 244, thus inducing or increasing the net dipole moment in the PAG 244. Alternatively, the PEG 242 is non-polar (i.e., having a zero net dipole moment) but is configured to form a polar bond with the PAG 244, thus inducing or increasing the net dipole moment in the PAG 244. Regardless of its own polarity, the PEG 242 draws electrons of the PAG 244 toward itself (i.e., shifting the electron density within the PAG 244) and effectively increases the dipole moment of the bond formed between the PEG 242 and the PAG 244. In further embodiment, the PAG 244 is configured to undergo ionic dissociation and separates into the cation 248 and the anion 250 during an exposure process. Accordingly, a magnitude of the dipole moment of the bond formed between the PEG 242 and the cation 248 (or the anion 250) is greater than that formed between the PEG 242 and the neutral PAG 244 prior to undergoing ionic dissociation.

In some embodiments, an atom of the PEG 242 exhibits a larger electronegativity than the atom of the PAG 244 (i.e., the cation 248 and/or the anion 250) to which it is bonded. In many embodiments, a portion of the PEG 242 bonded to the PAG 244 includes a halogen-containing functional group, such as a halo group (i.e., a halogen atom) including fluorine, chlorine, bromine, and/or iodine, a haloformyl group, other suitable halogen-containing groups, or combinations thereof; an oxygen-containing functional group, such as a hydroxyl group, a carbonyl group, a carboxyl group, a carboxylate group, an aldehyde group, an ester group, an ether group, a peroxy group, an epoxy group, an acetal group, an anhydride group, other suitable oxygen-containing groups, or combinations thereof; a nitrogen-containing functional group, such as a nitrile group, an isocyanate group, a nitro group, other suitable nitrogen-containing groups, or combinations thereof; a sulfur-containing functional group, such as a sulfide group, a sulfinyl group, a sulfonyl group, a sulfo group, other suitable sulfur-containing groups, or combinations thereof; a silicon-containing functional group, such as a siloxane group, a silane group, other suitable silicon-containing group, or combinations thereof; a hydrocarbon group, such as a substituted or non-substituted, branched or unbranched, cyclic or noncyclic, saturated or non-saturated alkyl, alkenyl, or alkynyl group; and/or other suitable functional groups. In some embodiments, the PEG 242 includes electrically neutral functional group(s). In other embodiments, the PEG 242 includes ionic (i.e., electrically charged) functional group(s). In some embodiments, the PEG 242 exhibits a net dipole moment (polar); in other embodiments, the PEG 242 exhibits no net dipole moment (non-polar).

The resist layer 208 may additionally include a photo-decomposable base (PDB) that, as the name suggests, decomposes basic moieties in response to the radiation. In some embodiments, the PDBs have a different photo-sensitivity (e.g., responds to radiation of a different range of wavelengths) compared to the PAGs (e.g., the PAG 244). The resist layer 208 may further include a photo-base generator (PBG) that produces basic moieties in response to the radiation. The resist layer 208 may further include a photo-decomposable quencher (PDQ) configured to reduce concentration of acidic moieties in regions where chemical changes (e.g., changes in solubility) are not desired. The resist layer 208 may also include a number of additives such as cross-linking agents (e.g., tetramethylol glycoluril linker or epoxy linker), surfactant, chromophores, and/or solvents.

The resist layer 208 may be formed using any suitable process, such as a spin-coating process. During the spin-coating process, the resist layer 208 in a liquid form is dispersed across a top surface of the underlying structure 210 (e.g., a top surface of the topmost material layer in the underlying structure 210) by a centrifugal force to a uniform or substantially uniform thickness. To facilitate the forming of the resist layer 208 during the spin-coating process, the resist layer 208 may include a solvent 260, which when removed, leaves the resist layer 208 in a solid or semisolid form (e.g., a film). The solvent 260 may include propylene glycol methyl ether acetate, propylene glycol monomethyl ether, gamma-butyrolactone, ethyl lactate, cyclohexanone, n-butyl actetate, ethyl ketone, dimethyl formamide, alcohol (e.g., isopropyl alcohol or ethanol), and/or other suitable solvents. The solvent 260 may be driven off (e.g., evaporated) as part of the spin-coating process, during a settling process, and/or during a post-application/pre-exposure baking process. The pre-exposure basking process may be implemented by any suitable equipment such as a hotplate, at any temperature suitable for the particular compositions of the resist layer 208 and the solvent employed.

Referring to FIGS. 1 and 5, the method 100 exposes the resist layer 208 to radiation 216 at operation 106. In many embodiments, the radiation 216 may be an Mine (wavelength approximately 365 nm), DUV radiation such as KrF excimer laser (wavelength approximately 248 nm) or ArF excimer laser (wavelength approximately 193 nm), EUV radiation (wavelength between about 1 nm and about 100 nm), an x-ray, an e-beam, an ion beam, and/or other suitable radiations. The exposure process at operation 106 may be performed in air, in a liquid (immersion lithography), or in vacuum (e.g., for EUV lithography and e-beam lithography). In the depicted embodiment, the exposure process at operation 106 is implemented using a photomask 218. The photomask 218 may be a transmissive mask or a reflective mask, each of which may further implement resolution enhancement techniques such as phase-shifting (e.g., an alternative phase-shift mask, an attenuated phase-shift mask, or a chromeless phase-shift mask), off-axis illumination (OAI) and/or optical proximity correction (OPC). In alternative embodiments, the radiation 216 is directly modulated with a predefined pattern, such as an IC layout, without using the photomask 218 (such as using an e-beam direct writer). In the depicted embodiment, the radiation 216 is EUV radiation and the exposure process at operation 106 is performed in a EUV lithography system. Correspondingly, the photomask 218 may be a reflective photomask used to pattern the resist layer 208.

Referring to FIG. 6, the exposure process at operation 106 forms a latent pattern on the resist layer 208 which includes exposed regions 212 and unexposed regions 214. The latent pattern generally refers to a pattern exposed on the resist layer, which eventually becomes a physical resist pattern when the resist layer is subjected to a developing process. The resist layer 208 in the exposed regions 212 undergo a series of photochemical reactions, while the resist layer 208 in the unexposed regions 214 remains substantially the same as the resist material prior to being exposed.

Specifically, upon absorbing the radiation 216 at operation 206, referring to FIG. 8, the PAG 244 included in the exposed regions 212 dissociates into the cation 248 and the antion 250, releasing acid including a proton $H^+$ (not shown), which then cleaves a protecting group (e.g., ALG; not shown)) bonded to the polymer 260. As a result, the photosensitive unit 240 decomposes into a molecular complex 270 and a molecular complex 272, where the molecular complex 270 includes the cation 248 and molecular complex 272 includes the anion 250. When the cation 248 loses electron(s) due to the dissociation of the PAG 244 at operation 206, it becomes more susceptible to disproportionate electron density shifts caused by the PEG 242. When the anion 250 gains electron(s) due to the dissociation of the PAG 244, it similarly becomes more susceptible to disproportionate electron density shifts caused by the PEG 242. Accordingly, magnitude of the dipole moment 278 after the exposure process is greater than that of the dipole moment 274 prior to the exposure process, where an effective charge of the cation 248 is zero due to its bond with the anion 250. Similarly, magnitude of the dipole moment 280 after the exposure process is also greater than that of the dipole moment 276 prior to the exposure process. As such, the polarity of the cation 248 in the molecular complex 270 and the polarity of the anion 250 in the molecular complex 272 in the exposed regions 212 increase following the exposure process at operation 106. In other words, chemically modifying the PAG 244 with the PEG 242 increases the polarity (i.e., the dipole moment) of the PAG 244 in the exposed regions 212 while the polarity (i.e., the dipole moment) of the PAG 244 remains substantially unaffected in the unexposed regions 214.

Referring to FIGS. 1, 7A, and 7B, the method 100 implements a developing process on the workpiece 200 at operation 108, thereby forming a pattern on the workpiece 200. The developing process implements a developer to dissolve or otherwise remove either the unexposed regions 214 (FIG. 7A) or the exposed regions 212 (FIG. 7B) depending upon molecular interaction between the developer and the resist layer, which will be discussed in detail below. In some embodiment, the developing process may begin with a post-exposure baking process, which may catalyze the decomposition of the PAG 244 and/or the cleaving of the protecting group by the acid released from the PAG 244. The developing process may be implemented by spraying the developer on the resist layer 208 by a spin-coating process. Thereafter, a post-exposure bake may be performed to stabilize the pattern formed on the workpiece 200.

Following the optional post-exposure baking process, a developer 222 may be used to remove the unexposed regions 214 during an NTD process (FIG. 7A), or alternatively, a developer 224 may be used to remove the exposed regions 212 during a PTD process (FIG. 7B). In the depicted embodiment, the developer 222 is a non-polar solvent, which includes molecules having zero net dipole moment, while the developer 224 is a polar solvent, which includes molecules have a non-zero net dipole moment. In many embodiments, the developer 222 includes an organic solvent, such as n-butyl acetate, ethanol, hexane, benzene, toluene, and/or other suitable solvents, while the developer 224 includes an aqueous solvent, such as tetramethyl ammonium hydroxide (TMAH), KOH, NaOH, and/or other suitable solvents.

As discussed above, the dissolution of the exposed regions 212 or the unexposed region 214 during the developing process may be controlled by, among other factors, the molecular interaction between the developer and the resist layer. In the depicted embodiment, due to a lack of exposure in the unexposed regions 214, the dipole moments 274 and 276 between the undissociated PAG 244 and the PEG 242 (FIG. 8) are weaker in magnitude than the dipole moments 278 and 280 between the dissociated PAG 244 (i.e., the cation 248 and/or the anion 250) and the PEG 242 in the exposed regions 212. In other words, the polarity of each of the cation 248 and the anion 250 in the exposed regions 212 of the resist layer 208 is greater than the polarity of the undissociated PAG 244 in the unexposed regions 214. Therefore, when applying the developer 222 (an organic solvent) during the NTD process, the solubility (i.e., extent of dissolution) of the exposed regions 212 including dissociated PAG 244 with a higher polarity, becomes less favorable in comparison to the solubility of the unexposed regions 214. Conversely, when applying the developer 224 (an aqueous solvent) during the PTD process the solubility of the exposed regions 212 becomes more favorable in comparison to the solubility of the unexposed regions 214. As a result, by increasing the polarity of the dissociated PAG 244 using the PEG 242 in the exposed regions 212, the dissolution process during both the NTD and the PTD processes may be more precisely controlled, and integrity of the resulting pattern may be improved. Stated differently, the PEG 242 is configured to increase solubility of the exposed regions 212 when the developer 224 is employed and decrease solubility of the exposed regions 212 when the developer 222 is employed.

Referring to FIG. 1, the method 100 performs additional fabrication processes at operation 110 that include, for example, transferring the pattern formed in the resist layer 208 to the middle layer 206 and the bottom layer 204 in one or more etching processes and subsequently removing the resist layer 208, the middle layer 206, and the bottom layer 204 following each etching process. The etching processes may be implemented by any suitable method including a dry etching process, a wet etching process, other suitable etching process, a reactive ion etching (RIE) process, and/or other suitable processes. Subsequently, the substrate 202 may be processed using the patterned bottom layer 204 as a mask. Any suitable method may be performed to process the substrate 202 including a deposition process, an implantation process, an epitaxial growth process, other fabrication process, or combinations thereof.

In many embodiments, following the operation 110, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Various advantages may be present in one or more embodiments of the methods, devices, and compositions described herein. For example, the present disclosure provides methods of improving qualities of pattern (e.g., such as LER, LWR, contrast, and/or uniformity in CD) and reducing energy dosage used during exposure process by controlling dissolution of the exposed pattern by a developer. Specifically, embodiments in the present disclosure are directed to methods of tuning polarity of photo-acid generator (PAG) by chemically modifying the PAG with at least one polarity-enhancing group (PEG), such that upon dissociating into a cation and an anion following an exposure process, the polarity of the PAG is increased due to an increased dipole moment of a bond established between the PAG and the PEG.

In one aspect, the present disclosure provides a method that comprises forming a photoresist layer over a substrate, exposing the photoresist layer to radiation, and developing the photoresist layer. In many embodiments, the photoresist layer includes a polymer blended with a photosensitive unit, the photosensitive unit including a polarity-enhancing group (PEG) bonded to a photo-acid generator (PAG), the PEG being configured to increase a dipole moment of the PAG.

In some embodiments, the exposing dissociates the PAG into a positively charged portion and a negatively charged portion, and the PEG increases the dipole moment of one or both of the positively charged portion and the negatively charged portion. In further embodiments, more than one PEG is bonded to the PAG. In some embodiments, one PEG is bonded to the negatively charged portion and more than one PEG is bonded to the positively charged portion. In still further embodiments, the PEG bonded to the positively charged portion of the PAG includes a halogen atom.

In some embodiments, the PEG includes a halogen-containing functional group, an oxygen-containing functional group, a nitrogen-containing functional group, a sulfur-containing functional group, a silicon-containing functional group, or combinations thereof.

In some embodiments, the photosensitive unit further includes a non-polar linker unit disposed between the PAG and the PEG, the non-polar linker unit including an alkyl group of 2-5 carbon atoms.

In some embodiments, the developing includes applying an aqueous solvent to remove an exposed region of the photoresist layer. In some embodiments, the developing includes applying an organic solvent to remove an unexposed region of the photoresist layer.

In another aspect, the present disclosure provides a method that comprises coating a substrate with a photoresist layer, exposing the photoresist layer to extreme ultraviolet (EUV) radiation, thereby forming an exposed region and an unexposed region in the photoresist layer, and applying a developer to the exposed region and the unexposed region of the photoresist layer. In many embodiments, the photoresist layer includes a polymer and a photo-acid generator (PAG) having a polarity-enhancing group (PEG) bonded to each end of the PAG.

In some embodiments, the exposing dissociates the PAG into a cation and an anion, and the PEG increases a dipole moment of the cation and the anion, respectively. In some embodiments, the PEG is configured to exhibit a net dipole moment. In some embodiments, the PEG is configured to exhibit no net dipole moment.

In some embodiments, where the developer is an aqueous solvent, the PEG increases solubility of the exposed regions of the photoresist layer in the developer. In some embodiments, wherein the developer is an organic solvent, the PEG decreases solubility of the exposed regions of the photoresist layer in the developer.

In yet another aspect, the present disclosure provides a method that comprises forming a photoresist layer over a substrate, performing an exposure process to the photoresist layer, performing a post-exposure bake to the photoresist layer, and performing a development process to the photoresist layer. In many embodiments, the photoresist layer includes a polymer, a photo-acid generator (PAG), wherein the PAG is separated from the polymer, and a polarity-enhancing group (PEG) bonded to the PAG. In many embodiments, the performing of the exposure process causes the PEG to increase a polarity of the PAG.

In some embodiments, the PEG includes a halo group, a hydroxyl group, a carbonyl group, a carboxyl group, a carboxylate group, an ether group, an epoxy group, a nitrile group, an isocyanate group, a nitro group, a sulfide group, a sulfinyl group, a sulfonyl group, a sulfo group, a siloxane group, a silane group, or combinations thereof.

In some embodiments, where the PEG is a first PEG and bonded to a first portion of the PAG, the PAG includes a second portion having a second PEG bonded thereto, and the performing of the exposure process separates the first portion from the second portion, such that each of the first PEG and the second PEG increases a polarity of each of the first portion and the second portion, respectively.

In some embodiments, the performing of the exposure process includes exposing the photoresist layer to an extreme ultra-violet (EUV) source.

In some embodiments, the photoresist layer includes at least 15% of PAG by weight.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a photoresist layer over a substrate, wherein the photoresist layer includes a polymer blended with a photosensitive unit, wherein the photosensitive unit includes multiple polarity-enhancing groups (PEGs) bonded to a photo-acid generator (PAG), and wherein each PEG includes a silicon-containing functional group;
   exposing the photoresist layer to radiation, thereby forming an exposed region and an unexposed region in the photoresist layer, wherein the exposing dissociates the PAG in the exposed region into a positively charged portion and a negatively charged portion, and wherein the PEG increases magnitude of dipole moment between the negatively charged portion and the PEG or magnitude of dipole moment between the positively charged portion and the PEG; and
   developing the photoresist layer in a developer, wherein the increase in magnitude of the dipole moment reduces solubility of the exposed region in the developer with respect to the unexposed region.

2. The method of claim 1, wherein one PEG is bonded to the negatively charged portion and more than one PEG are bonded to the positively charged portion.

3. The method of claim 2, wherein the PEG bonded to the positively charged portion of the PAG includes the silicon-containing group.

4. The method of claim 1, wherein the PEGs each include a siloxane group, a silane group, or a combination thereof.

5. The method of claim 1, wherein the photosensitive unit further includes a non-polar linker unit disposed between the PAG and each PEG, the non-polar linker unit including an alkyl group of 2-5 carbon atoms.

6. The method of claim 1, wherein the positively charged portion of the PAG is bonded to a first PEG and the negative charged portion of the PAG is bonded to a second PEG, and wherein the first PEG and the second PEG have the same composition.

7. The method of claim 1, wherein the positively charged portion of the PAG is bonded to a first PEG and the negatively charged portion of the PAG is bonded to a second PEG, and wherein the first PEG or the second PEG includes a non-polar linker unit bonded to the positively charged portion of the PAG or the negatively charged portion, respectively.

8. The method of claim 1, wherein the positively charged portion of the PAG is bonded to a first number of PEGs and the negatively charged portion of the PAG is bonded to a second number of PEGs, and wherein the first number is the same as the second number.

9. A method, comprising:
   coating a substrate with a photoresist layer, wherein the photoresist layer includes a polymer and a photo-acid generator (PAG), wherein the PAG includes polarity-enhancing groups (PEGs) each having a silicon-containing functional group, wherein a first number of the PEGs are bonded to a positively charged end of the PAG, and a second number of the PEGs are bonded to a negatively charged end of the PAG, and wherein the first number equals to the second number;
   exposing the photoresist layer to extreme ultraviolet (EUV) radiation, thereby forming an exposed region and an unexposed region in the photoresist layer, wherein each PEG increases magnitude of a dipole moment between the PEG and the PAG; and
   applying a developer to the exposed region and the unexposed region of the photoresist layer, wherein molecular interaction between the unexposed region and the developer is stronger than that between the exposed region and the developer.

10. The method of claim 9, wherein each PEG is configured to exhibit a net dipole moment.

11. The method of claim 9, wherein each PEG is configured to exhibit no net dipole moment.

12. The method of claim 9, wherein the developer is an organic solvent, and wherein the PEGs decrease solubility of the exposed region of the photoresist layer in the developer.

13. The method of claim 12, wherein the organic solvent includes, propylene glycol monomethyl ether, gamma-butyrolactone, ethyl lactate, cyclohexanone, ethyl ketone, dimethyl formamide, ethanol, isopropyl, alcohol, or combinations thereof.

14. The method of claim 9, wherein the developer is an organic solvent configured to remove the unexposed region.

15. The method of claim 9, wherein each PEG includes a siloxane group, a silane group, or a combination thereof.

16. A method, comprising:
   forming a photoresist layer over a substrate, wherein the photoresist layer includes:
      a polymer;
      a photo-acid generator (PAG), wherein the PAG is separated from the polymer; and
      a plurality of silicon-containing polarity-enhancing groups (PEGs) bonded to a positively charged end and a negatively charged end of the PAG, wherein a number of the PEGs bonded to the positively charged end of the PAG is the same as a number of the PEGs bonded to the negatively charged end of the PAG;
   performing an exposure process to the photoresist layer, thereby forming an exposed region and an unexposed region in the photoresist layer; wherein the performing of the exposure process causes the PEGs to increase polarity of the PAG in the exposed region with respect to the unexposed region;
   performing a post-exposure bake to the photoresist layer; and
   performing a development process to the photoresist layer in a solvent, wherein the PEGs decrease solubility of the exposed region relative to the unexposed region in the solvent, such that the unexposed region is removed by the solvent.

17. The method of claim 16, wherein the PEGs each include a siloxane group, a silane group, or a combination thereof.

18. The method of claim 16, wherein the performing of the exposure process separates the positively charged end from the negatively charged end, such that the PEGs increase a polarity of each of the positively charged end and the negatively charged end.

19. The method of claim 16, wherein the performing of the exposure process includes exposing the photoresist layer to an extreme ultra-violet (EUV) source.

20. The method of claim 19, wherein the photoresist layer includes at least 15% of the PAG by weight.

* * * * *